United States Patent
Tseng et al.

(10) Patent No.: US 8,626,482 B2
(45) Date of Patent: Jan. 7, 2014

(54) EQUIVALENT CIRCUIT SIMULATION SYSTEM AND METHOD

(75) Inventors: Wen-Laing Tseng, Taipei Hsien (TW);
Cheng-Hsien Lee, Taipei Hsien (TW);
Shen-Chun Li, Taipei Hsien (TW);
Yu-Chang Pai, Taipei Hsien (TW);
Shou-Kuo Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 463 days.

(21) Appl. No.: 12/958,397

(22) Filed: Dec. 2, 2010

(65) Prior Publication Data

US 2011/0301922 A1 Dec. 8, 2011

(30) Foreign Application Priority Data

Jun. 2, 2010 (TW) .............................. 99117720 A

(51) Int. Cl.
*G06F 17/50* (2006.01)
(52) U.S. Cl.
CPC .................................. *G06F 17/5022* (2013.01)
USPC ............................................... 703/14; 703/2
(58) Field of Classification Search
USPC ........................................................ 703/2, 14
See application file for complete search history.

(56) References Cited

U.S. PATENT DOCUMENTS

2003/0065498 A1 * 4/2003 Bois et al. ........................ 703/19

OTHER PUBLICATIONS

Antonini. "SPICE Equivalent Circuits of Frequency-Domain Responses"., IEEE 2003., p. 502-512.*
Lamecki et al. "Equivalent SPICE Circuits with Guaranteed Passivity From Nonpassive Models", IEEE, Mar. 2007., p. 526-532.*
Braken et al. "Extension of the Asymptotic Waveform Evaluation Technique with the Method of Characteristics"., 1992 IEEE., p. 71-75.*
Lempel et al. "The K Matrix of n-Port Networks: Analysis and Synthesis"., IEEE 1969., p. 471-483.*
Schutt-Aine., "A Frequency-Dependent Transmission-Line Simulator Using S-Parameters", EMC 2004, p. 525528.*

* cited by examiner

*Primary Examiner* — Eunhee Kim
(74) *Attorney, Agent, or Firm* — Altis Law Group, Inc.

(57) ABSTRACT

A simulation system for producing equivalent circuits reads data corresponding to a tabular W element format in a storage device, and adds data of the tabular W element format file using interpolation algorithm. A frequency-dependent transmission matrix is transformed into an N-port network matrix describing electrical properties of a multi-input and multi-output network. An N-port network matrix is transformed into a S-parameter matrix. A range of frequency of a s-parameter is determined and numbers of pole-residue, times for recursion and durable maximum system errors in the equivalent circuit is also determined. A vector fitting algorithm is performed and a rational function matrix composed with s-parameters is produced, to produce a general SPICE equivalent circuit based on the generated rational function matrix.

15 Claims, 6 Drawing Sheets

EQUIVALENT CIRCUIT SIMULATION SYSTEM AND METHOD

BACKGROUND

1. Technical Field

The present application is related to simulation systems, especially to a simulation system and method for transforming files in Tabular W-element format into general SPICE (Simulation Program with Integrated Circuit Emphasis) equivalent circuits.

2. Description of Related Art

Field solver applications, such as Q3D of Ansoft Inc., and Hspice of Synopsys Inc., are commonly used in obtaining equivalent models, composed of frequency dependent resistances, inductances, reactances, and capacitances (RLGC), of striplines and microstrips on a printed circuit board (PCB). To consider skin effects and dielectric lost in transmission lines of a PCB, transforming of the RLGC models by SISTAI of Intel Inc., is necessary for accuracy of the result. However, the syntax of the equivalent models is formatted in a Tabular W-element standard, which is not compatible with general circuit simulation software, such as Pspice software of Cadence Inc., SPDSIM of Sigrity Inc., and Simplis software of SIMetrix Inc. Therefore, the equivalent models in Tabular W-element syntax are limited in further applications.

DETAILED DESCRIPTION

SPICE is a general-purpose open source analog electronic circuit simulator. It is a powerful program that is used in IC and board-level design to check the integrity of circuit designs and to predict circuit behavior.

Figure 1:
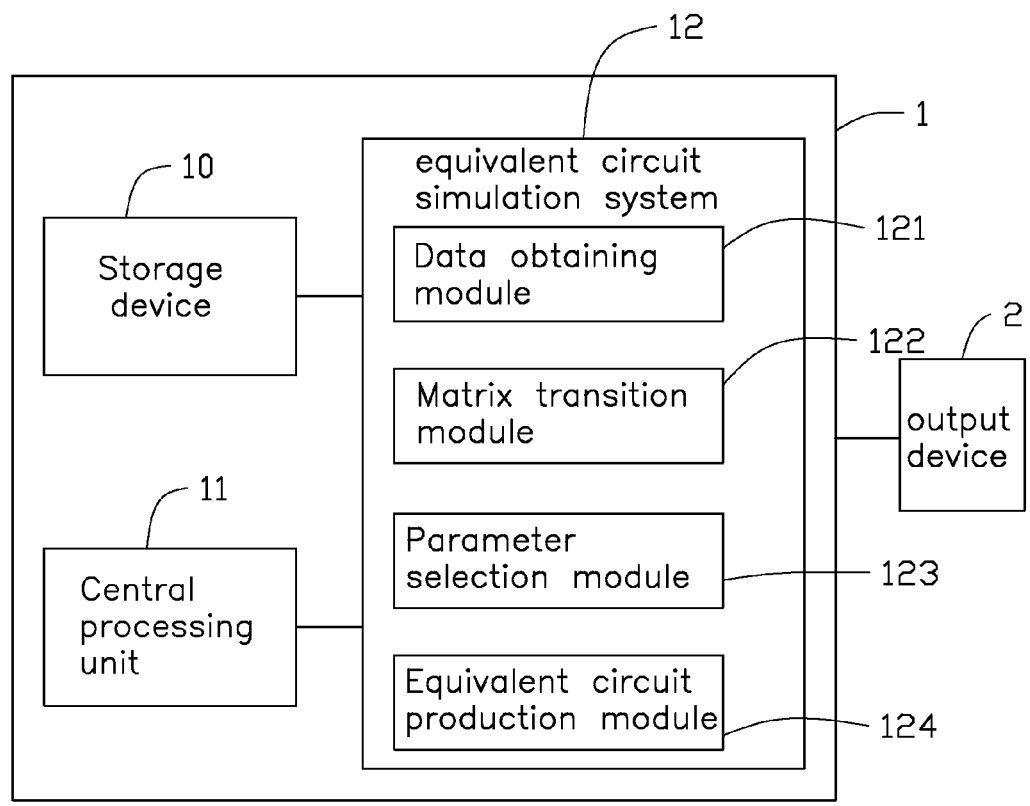
FIG. 1 is a block diagram of one embodiment of a computer comprising an equivalent circuit simulation system for general SPICE.

FIG. 1 is a block diagram of one embodiment of a computer 1 comprising an equivalent circuit simulation system for general SPICE 12. The computer 1 further comprises a storage device 10 and a central processing unit 11 (CPU). The computer 1 is connected to an output device 2, such as a display, for outputting generated equivalent circuits. The storage device 10 is configured for storing information of resistances, inductances, reactances, and capacitances presented in a Tabular W-element syntax format. The equivalent circuit simulation system 12 is configured for reading data presented in the Tabular W-element standard format, such as data files in *.tab, producing an equivalent circuit file (e.g., one or more files comprising data of an equivalent circuit of the data presented in the Tabular W-element standard format) corresponding to the data, and outputting the equivalent circuit to the output device 2. The generated equivalent circuit file is compatible with general-purpose open source analog circuit simulators using SPICE syntax, such as Pspice of Cadence Inc., SPDSIM of Sigrity Inc., and Simplis of SIMetrix Inc. The equivalent circuit files are used to check the integrity of circuit designs and to predict circuit behavior.

In this embodiment, the equivalent circuit simulation system 12 comprises an acquisition module 121, a first parameter transformation module 122, a parameter determination module 123, and an equivalent circuit production module 124. The storage device 10 may be a memory system of the computer 1. The modules 121-124 may comprise computerized code in the form of one or more programs that are stored in the storage device 10. The computerized code includes instructions that are executed by the CPU 11 to provide functions for modules 121-124.

The acquisition module 121 is configured for reading data corresponding to the Tabular W-element format in the storage device 10, and supplementing the Tabular W element format file using an interpolation algorithm. The obtained frequency-dependent matrix is a tabular W element RLGC model comprising resistance, inductance, reactance, and capacitance information of a circuit.

The first parameter transformation module 122-1 transforms a RLGC matrix into an N-port network matrix describing electrical properties of a multi-input and multi-output network. The second parameter transformation module 122-2 transforms the N-port network matrix into a S-parameter matrix, a diverging matrix describing a relationship between an incident voltage wave and a reflective voltage wave in a high frequency circuit. An S-parameter is a parameter representing a circuit frequency, and built by the relationship between the incident voltage wave and the reflective voltage wave.

The parameter determination module 123 is configured for determining a range of frequency of a s-parameter, to increase accuracy of vector fitting in a RLGC matrix, and to select numbers of pole-residue, times for recursion and durable maximum system errors in an equivalent circuit simulation.

The equivalent circuit production module 124 is configured for performing a vector fitting algorithm, producing a rational function matrix composed with s-parameters, and producing a general SPICE equivalent circuit based on the generated rational function matrix. The equivalent circuit production module 124 is configured for determining if a root mean square of the error of the rational function matrix is less than the selected system errors, and increasing the numbers of pole-residue to perform vector fitting when the system error is more than the root mean square of the error of the rational function matrix.

Figure 2:
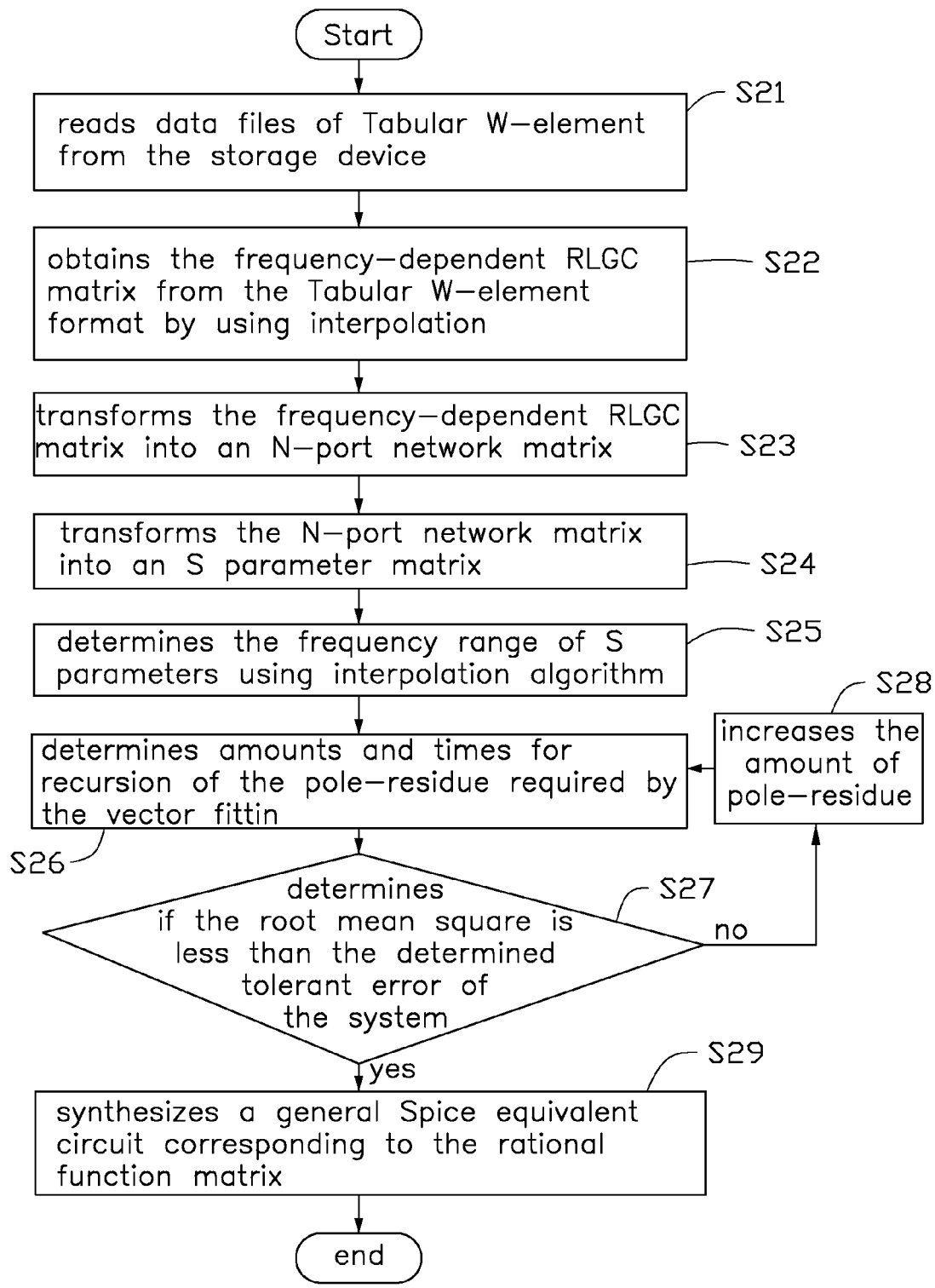
FIG. 2 is a flowchart illustrating one embodiment of a method for simulating general SPICE equivalent circuits.

FIG. 2 is a flowchart illustrating one embodiment of a method for simulating general SPICE equivalent circuits. The method produces equivalent circuits for general SPICE based on the rational function matrix. Depending on the embodiment, additional blocks in the flow of FIG. 2 may be added, others removed, and the ordering of the blocks may be changed.

In block S21, the acquisition module 121 reads data files of Tabular W-element from the storage device 10. In block S22, the acquisition module 121 obtains the frequency-dependent RLGC matrix from the Tabular W-element format by using interpolation. The frequency-dependent RLGC matrix is composed of tabular W-element format and comprises information of resistance, inductance, reactance and capacitance.

In block S23, the first parameter transformation module 122-1 transforms the frequency-dependent RLGC matrix into an N-port network matrix. The transformation is shown below.

$$T = e^{(D+sE)l}, \quad (1)$$

$$\text{wherein } D = \begin{bmatrix} 0 & -R(s) \\ -G(s) & 0 \end{bmatrix},$$

$$E = \begin{bmatrix} 0 & -L(s) \\ -C(s) & 0 \end{bmatrix}$$

$s=j\omega$, $l$=the length of the transmission line.

In block S24, the second parameter transformation module 122-2 transforms the N-port network matrix into an S parameter matrix. The transformation is shown below.

$$Y = \begin{bmatrix} Y_{11} & Y_{12} \\ Y_{21} & Y_{22} \end{bmatrix} = \begin{bmatrix} -T_{12}^{-1}T_{11} & T_{12}^{-1} \\ -T_{21} + T_{22}T_{12}^{-1}T_{11} & -T_{22}T_{12}^{-1} \end{bmatrix} \quad (2)$$

Secondly, the Y parameter is substituted into formula (3) as follows.

$$S = (I_N + Z_0^{1/2} Y Z_0^{1/2})^{-1}(I_N - Z_0^{1/2} Y Z_0^{1/2}) \quad (3)$$

In formula (3), $I_N$ is a N×N identity matrix, $Z_0$ is a reference resistor, and $Z_0 = 50 1_N$. According to formula (3), the S parameter matrix is obtained.

In block S24, the parameter determination module 123 determines the frequency range of S parameters using interpolation algorithm, to increase the accuracy of vector fitting in the RLGC matrix. In block S25, the parameter determination module 123 determines amounts and times for recursion of the pole-residue required by the vector fitting. A rational function made by m pairs of pole-residue can be obtained by formula (4). By setting the amount and times for recursion, the accuracy of formula (4) will be increased.

$$f(s) = \sum_{m=1}^{M} \frac{r_m}{s + p_m} + d + se \quad (4)$$

In formula (4), $f(s)$ represents a continuation function, $r_m$ represents a residue, and $p_m$ represents a pole.

S parameter matrix can be obtained by formula (5).

$$S(s) = \begin{bmatrix} S_{11}(s) & S_{12}(s) & \ldots & S_{1N}(s) \\ S_{21}(s) & S_{22}(s) & \ldots & S_{2N}(s) \\ \ldots & \ldots & \ldots & \ldots \\ S_{N1}(s) & S_{N2}(s) & \ldots & S_{NN}(s) \end{bmatrix} \quad (5)$$

A rational function matrix is obtained by performing vector fitting on each vector in formula (5).

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix}, \quad (6)$$

$$\hat{S}_{ij}(s) = \sum_{m=1}^{M} \frac{r_m^{i,j}}{s + p_m^{i,j}} + k^{i,j} + se^{i,j}$$

The real part of $p_m^{i,j}$ is larger than 0, that is $p_m^{i,j} > 0$.

In block S26, the equivalent circuit production module 124 performs vector fitting on a determined amount of pole-residue to obtain a rational function matrix of S matrix. In block S27, the equivalent circuit production module 124 determines if the root mean square of the rational function matrix is less than the determined tolerant error of the system. In block S28, if the root mean square error is larger than or equals the tolerant error of the system, the equivalent circuit production module 124 increases the amount of pole-residue and then performs vector fitting. In block S29, if the root mean square error is less than the tolerant error of the system, the equivalent circuit production module 124 synthesizes a general SPICE equivalent circuit corresponding to the rational function matrix.

Figure 3:
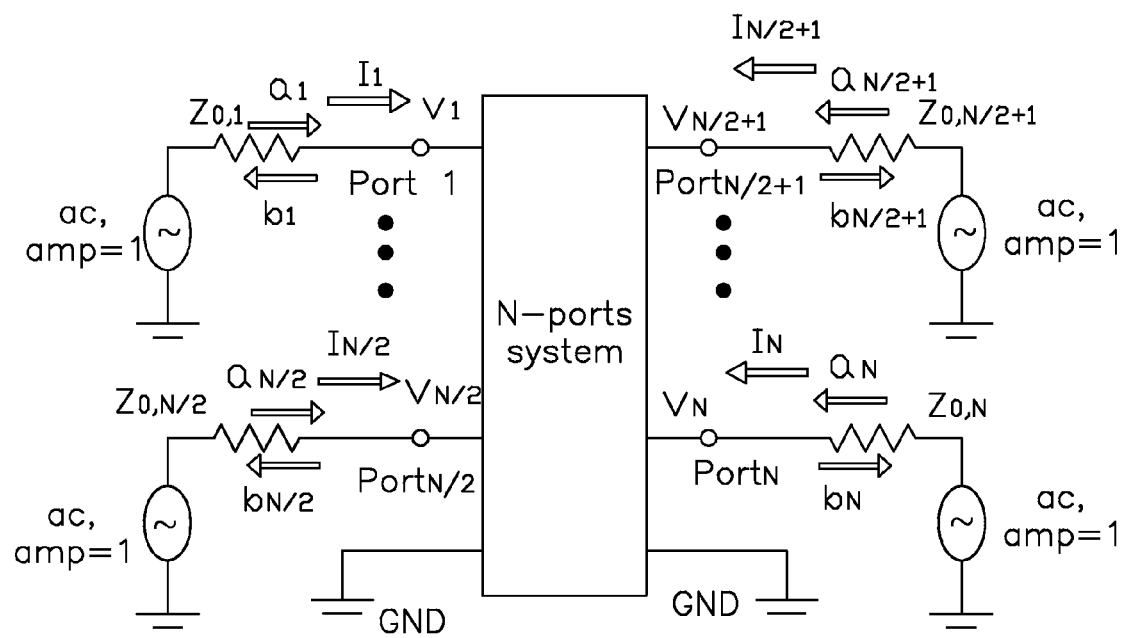
FIG. 3 is a drawing illustrating an exemplary N-port circuit system.

FIG. 3 is a drawing illustrating an N-port circuit system, where "a" represents an incident wave of the S parameter, and "b" represents the reflected wave of the S parameter. $Z_0$ represents a corresponding referential resistance. The S parameter of the N port circuit network can be presented as formula (7):

$$b = Sa, \text{ where } a = \begin{bmatrix} a_1 \\ a_2 \\ \ldots \\ a_N \end{bmatrix}, b = \begin{bmatrix} b_1 \\ b_2 \\ \ldots \\ b_N \end{bmatrix} \quad (7)$$

The relationship among the incident wave "a", reflective wave "b", the port voltage V and the port current I can be represented by formula (8):

$$a = \frac{1}{2}Z_0^{-1/2}(V + Z_0 I), b = \frac{1}{2}Z_0^{-1/2}(V - Z_0 I), \quad (8)$$

$$\text{Wherein } V = \begin{bmatrix} V_1 \\ V_2 \\ \ldots \\ V_N \end{bmatrix}, I = \begin{bmatrix} I_1 \\ I_2 \\ \ldots \\ I_N \end{bmatrix}, Z_0 = \begin{bmatrix} Z_{0,1} & 0 & \ldots & 0 \\ 0 & Z_{0,2} & \ldots & 0 \\ \ldots & \ldots & \ldots & \ldots \\ 0 & 0 & \ldots & Z_{0,N} \end{bmatrix}$$

The relationship among voltage, current and S parameters can be obtained by formula (9):

$$I = Z_0^{-1}V - Z_0^{-1/2}SZ_0^{1/2}(Z_0^{-1}V + I) \quad (9)$$

Formula (10) can be obtained by substituting the rational function matrix formula (6) into formula (9):

$$\begin{bmatrix} I_1 \\ I_2 \\ \cdots \\ I_N \end{bmatrix} = \begin{bmatrix} \frac{V_1}{Z_{o,1}} \\ \frac{V_2}{Z_{o,2}} \\ \cdots \\ \frac{V_2}{Z_{o,N}} \end{bmatrix} - \begin{bmatrix} \hat{S}_{11}(s) & \hat{S}_{12}(s) & \cdots & \hat{S}_{1N}(s) \\ \hat{S}_{21}(s) & \hat{S}_{22}(s) & \cdots & \hat{S}_{2N}(s) \\ \cdots & \cdots & \cdots & \cdots \\ \hat{S}_{N1}(s) & \hat{S}_{N2}(s) & \cdots & \hat{S}_{NN}(s) \end{bmatrix} \begin{bmatrix} \tilde{V}_1 \\ \tilde{V}_2 \\ \cdots \\ \tilde{V}_N \end{bmatrix}, \quad (10)$$

Wherein $\tilde{V}_i = \left( \frac{V_i}{Z_{o,i}} + I_i \right)$

The residue of $\hat{S}_{ij}(s)$ can be represented as real parts and complex parts as formula (11):

$$\hat{S}_{ij}(s) = \hat{S}r_{ij}(s) + \hat{S}c_{ij}(s) + k^{i,j} + se^{i,j} \quad (11)$$

$\hat{S}_{ij}(s)$ and $\hat{S}c_{ij}(s)$ can be represented by formula (12):

$$\hat{S}r_{ij}(s) = \sum_{u=1}^{U} \frac{r_u^{i,j}}{s + p_u^{i,j}}, \; r_u^{i,j} > 0 \text{ for } u < U^+, r_u^{i,j} \leq 0 \text{ for } u > U^+ \quad (12a)$$

$$\hat{S}c_{ij}(s) = \sum_{v=1}^{V} \frac{c_v^{i,j} + d_v^{i,j} j}{s + (a_v^{i,j} + b_v^{i,j} j)} + \frac{c_v^{i,j} - d_v^{i,j} j}{s + (a_v^{i,j} - b_v^{i,j} j)}, \quad (12b)$$

$c_v^{i,j} \leq 0$ for $v \leq V^+$, $c_v^{i,j} < 0$ for $v > V^+$

Wherein $U+2V=M$, $p_u^{i,j}>0$, $\alpha_v^{i,j}>0$, $b_v^{i,j}>0$, $d_v^{i,j}>0$.

Figure 4:
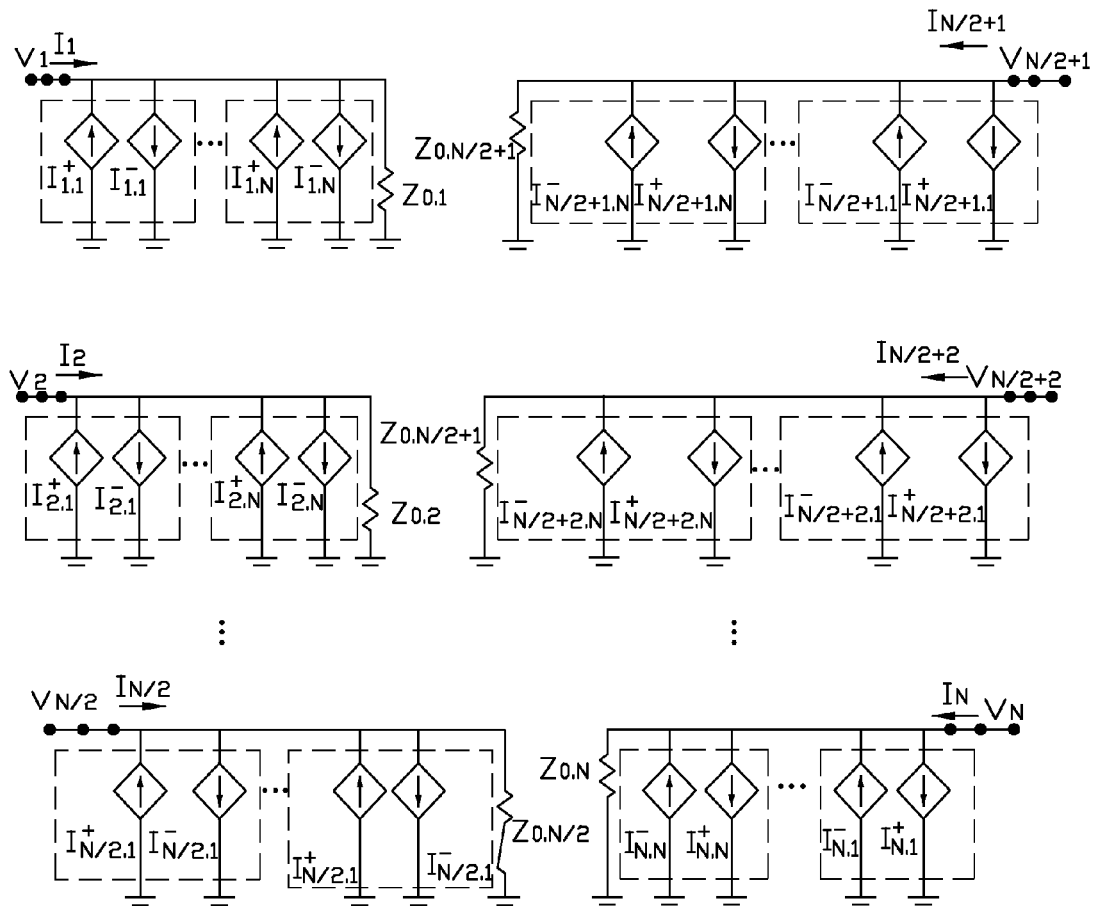
FIG. 4 is a drawing illustrating a main equivalent circuit generated by one embodiment of the equivalent circuit simulation system.
Figure 5:
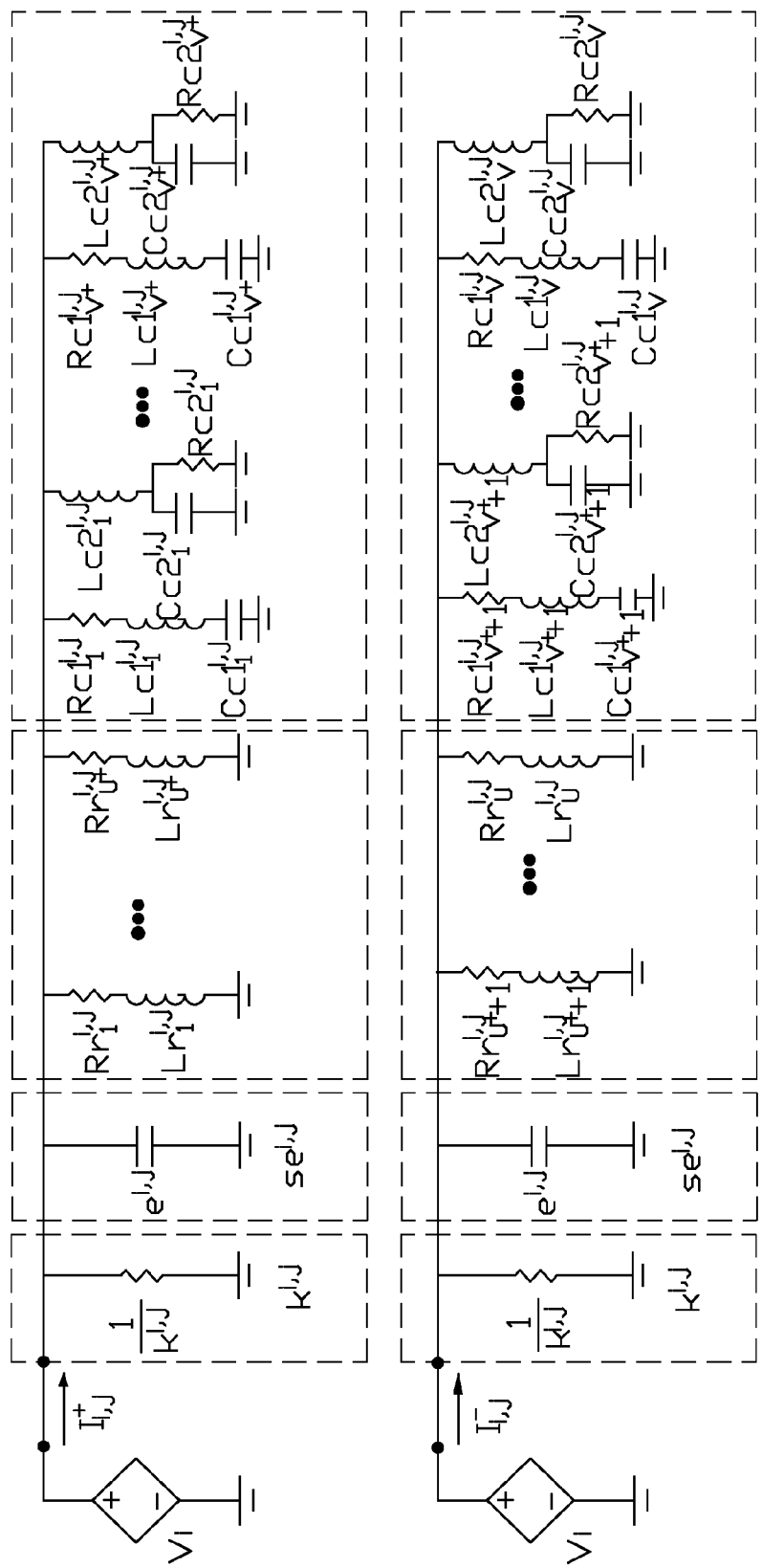
FIG. 5 is a drawing illustrating an exemplary first sub-equivalent circuit generated by one embodiment of the equivalent circuit simulation system.
Figure 6:
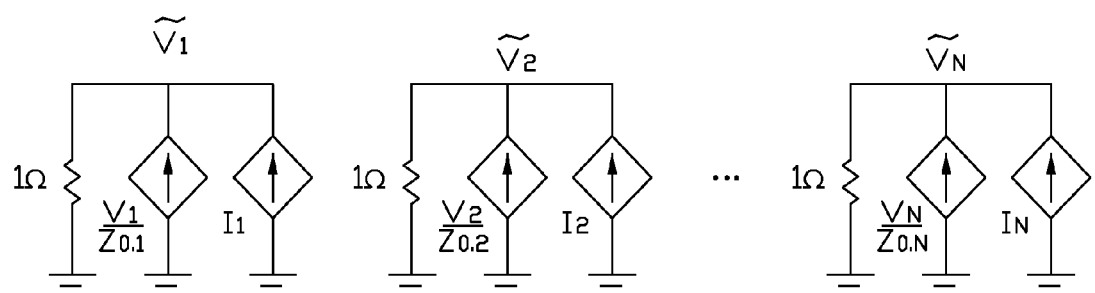
FIG. 6 is a drawing illustrating a second sub-equivalent circuit generated by one embodiment of the equivalent circuit simulation system.

FIGS. 4 to 6 show equivalent circuits stimulated and synthesized based on formulas (10) to formula (12).

FIG. 4 illustrates a main equivalent circuit represented by a general SPICE format. FIG. 5 to FIG. 6 illustrate a first sub-equivalent and a second sub-equivalent circuit of the equivalent circuit of FIG. 4.

The equivalent circuit generated by the circuit simulation system and method as disclosed is capable of transforming a Tabular W-element format (*.tab) to a general SPICE format with high accuracy, and increases convenience in signal simulation.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A computer system, comprising:
a central processing unit;
a storage device storing one or more programs, the one or more programs comprising:
an acquisition module configured for reading a data file corresponding to a W-element format in the storage device, wherein the W-element is a transmission line model in HSPICE, and obtain a frequency-dependent transmission matrix from the data file using an interpolation algorithm;
a first parameter transformation module configured for transforming the frequency-dependent transmission matrix into an N-port network matrix, wherein the N-port network matrix describes electrical properties of a multi-input and multi-output network;
a second parameter transformation module configured for transforming the N-port network matrix into a S-parameter matrix;
a parameter determination module configured for determining a range of frequency of a S-parameter in the S-parameter matrix, and for determining numbers of pole-residue, a number of recursion of a vector fitting occurs, and durable maximum system errors in an equivalent circuit simulation; and
an equivalent circuit production module configured for performing a vector fitting algorithm, producing a rational function matrix composed with the S-parameters, wherein the rational function matrix comprises function for determining the S-parameters in the S-parameter matrix, and producing an equivalent circuit compatible with HSPICE format based on the generated rational function matrix.

2. The computer system as claimed in claim 1, wherein the equivalent circuit production module is configured for determining if a root mean square of the error of the rational function matrix is less than selected system errors, and increasing numbers of pole-residue to perform vector fitting when the system error is more than the root mean square of the error of the rational function matrix.

3. The computer system as claimed in claim 1, wherein the frequency-dependent transmission matrix is a tabular resistances, inductances, reactances, and capacitances (RLGC) model for W-element comprising information of resistance, inductance, reactance, and capacitance.

4. The computer system as claimed in claim 1, wherein the N-port network matrix describes electrical properties of a multi-input and multi-output network, and connection relationship therebetween.

5. The computer system as claimed in claim 1, wherein the S-parameter matrix is a diverging matrix describing relationship between an incident voltage wave and a reflective voltage wave in a high frequency circuit.

6. An equivalent circuit simulation method, comprising:
reading a data file corresponding to a W-element format in a storage device, wherein the W-element is a transmission line model in HSPICE;
obtaining a frequency-dependent transmission matrix from the data file using interpolation algorithm;
transforming the frequency-dependent transmission matrix into a N-port network matrix, wherein the N-port network matrix describes electrical properties of a multi-input and multi-output network;
transforming the N-port network matrix into a S-parameter matrix;
determining a range of frequency of a S-parameter in the S-parameter matrix by using the interpolation algorithm;
determining numbers of pole-residue, a number of recursion of a vector fitting occurs and durable maximum system errors in an equivalent circuit simulation;
producing a rational function matrix composed with the S-parameters by performing a vector fitting algorithm, wherein the rational function matrix is a function for determining the S-parameters in the S-parameter matrix; and
producing an equivalent circuit compatible with HSPICE format based on the generated rational function matrix.

7. The equivalent circuit simulation method as claimed in claim 6, further comprising:
determining if a root mean square of the error of the rational function matrix is less than selected system errors; and increasing numbers of pole-residue to perform vector fitting when the system error is more than the root mean square of the error of the rational function matrix.

8. The equivalent circuit simulation method as claimed in claim 6, wherein the frequency-dependent transmission matrix is a tabular RLGC model for W-element comprising information of resistance, inductance, reactance, and capacitance.

9. The equivalent circuit simulation method as claimed in claim 6, wherein the N-port network matrix describing electrical properties of a multi-input and multi-output network, and connection relationship therebetween.

10. The equivalent circuit simulation method as claimed in claim 6, wherein the S-parameter matrix is a diverging matrix describing relationship between an incident voltage wave and a reflective voltage wave in a high frequency circuit.

11. A non-transitory storage medium having stored thereon instructions that, when executed by a processor, causing the processor to perform an equivalent circuit simulation method, wherein the method comprises:

reading a data file corresponding to a W element format in a storage device, wherein the W-element is a transmission line model in HSPICE;

obtaining a frequency-dependent transmission matrix from the data file using an interpolation algorithm;

transforming the frequency-dependent transmission matrix into a N-port network matrix, wherein the N-port network matrix describes electrical properties of a multi-input and multi-output network;

transforming the N-port network matrix into a S-parameter matrix;

determining a range of frequency of a S-parameter in the S-parameter matrix by using the interpolation algorithm;

determining numbers of pole-residue, a number of recursion of a vector fitting occurs and durable maximum system errors in an equivalent circuit simulation; and producing a rational function matrix composed with the S-parameters by performing a vector fitting algorithm, wherein the rational function matrix is a function for determining the S-parameters in the S-parameter matrix;

producing an equivalent circuit compatible with HSPICE format based on the generated rational function matrix.

12. The non-transitory storage medium as claimed in claim 11, wherein the equivalent circuit simulation method further comprising:

determining if a root mean square of the error of the rational function matrix is less than selected system errors; and increasing numbers of pole-residue to perform vector fitting when the system error is more than the root mean square of the error of the rational function matrix.

13. The non-transitory storage medium as claimed in claim 11, wherein the frequency-dependent transmission matrix is a tabular RLGC model for W-element comprising information of resistance, inductance, reactance, and capacitance.

14. The non-transitory storage medium as claimed in claim 11, wherein the N-port network matrix describing electrical properties of a multi-input and multi-output network, and connection relationship therebetween.

15. The non-transitory storage medium as claimed in claim 11, wherein the S-parameter matrix is a diverging matrix describing relationship between an incident voltage wave and a reflective voltage wave in a high frequency circuit.

* * * * *